March 17, 1970 W. D. COMPTON ET AL 3,501,638

INFRARED CONVERTER USING TUNNELING EFFECT

Filed Oct. 25, 1967

INVENTORS
W. DALE COMPTON
WILLIAM PAUL BLEHA, JR.
BY Merriam, Marshall, Shapiro & Klose
ATTORNEYS 3,501,638

INFRARED CONVERTER USING TUNNELING EFFECT

Walter Dale Compton, Urbana, and William Paul Bleha, Jr., Villa Park, Ill., assignors to University of Illinois Foundation, Urbana, Ill., a corporation of Illinois Filed Oct. 25, 1967, Ser. No. 678,102
Int. Cl. G01t *1/16;* H01j *39/02*
U.S. Cl. 250—83.3 9 Claims

ABSTRACT OF THE DISCLOSURE

A solid state infrared converter having a narrow band gap semiconductor absorbing infrared radiation directed thereto, and a wide band gap semiconductor emitting the desired radiation. Minority carriers produced in the narrow band gap semiconductor traverse through a thin insulating film between the two semiconductors by what is believed to be a tunneling process to recombine with majority carriers to generate electromagnetic radiation characteristic of the energy of the wide band gap semiconductor.

FIELD OF THE INVENTION

This invention relates to the conversion of infrared radiation to other wavelengths, and in particular, to the conversion of infrared radiation into the visible or ultraviolet wavelengths.

DESCRIPTION OF THE PRIOR ART

While the present invention can be used to convert infrared radiation into the ultraviolet region, it is especially useful for direct conversion to the visible wavelengths. Various techniques have been utilized for detecting infrared radiation and converting the detected radiation into other wavelengths, such as the visible light band. Such devices have required the use of a relatively high amplitude alternating voltage, on the order of 100 volts, necessitating an alternating current supply. Rather elaborate vacuum systems are also required to protect prior art infrared to visible conversion devices from adverse environmental affects. Thus, in general, all practical prior art devices are somewhat bulky and inconvenient due to the large amount of extra equipment necessary for operation.

SUMMARY OF THE INVENTION

The present invention provides infrared conversion through the conveyance of minority carriers into semiconducting materials by what is believed to be a tunneling process through an insulating film, which ideally can yield a luminescence characteristic of the band gap of the semiconducting material. In accordance with one aspect of the invention, the transfer or tunneling of minority carriers through a thin insulating film and from a narrow band gap semiconductor into a wide band gap semiconductor is used to directly convert infrared photons to visible photons. The infrared radiation is absorbed in the narrow band gap semiconductor either by extrinsic absorption resulting from impurities or defects introduced into the lattice or by intrinsic absorption.

The wide band gap semiconductor is chosen so that its band gap corresponds to the desired wavelength of the emitted photons. With the infrared radiation impinging on the narrow band gap semiconductor, and a suitable bias voltage applied between the two semiconductors, holes produced by absorption of the infrared photons in an n-type narrow band semiconductor will tunnel through the thin insulating film junction and recombine with electrons in the n-type wide band semiconductor thereby generating photons of light.

BRIEF DESCRIPTION OF THE DRAWINGS

The invention will be better understood from the following detailed description thereof taken in conjunction with the accompanying drawings in which.

DESCRIPTION OF THE PREFERRED EMBODIMENTS

Figure 1:
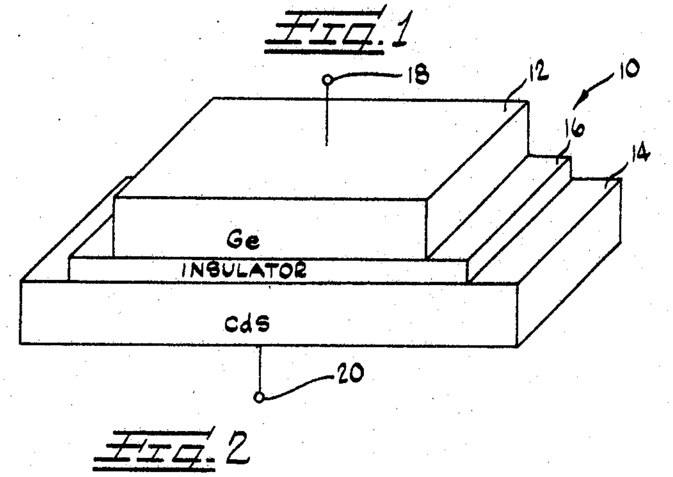
FIGURE 1 is a schematic diagram illustrating the construction of an infrared to visible light converter in accordance with the principles of the present invention.

Referring now to FIGURE 1 there is illustrated an infrared conversion device 10 which includes two n-type semiconductors 12 and 14 at 77° Kelvin separated by a very thin insulating film 16 of silicon monoxide, aluminum oxide, magnesium oxide, germanium sulfide, polymerized films of organics, or similar type material well known in the art. The insulating film 16 should be on the order of about 100 angstroms thick so as to enable minority carriers to tunnel through the film. The thin insulating film 16 can be evaporated onto the semiconductors 12 and 14 or can be chemically grown thereon by well-known techniques. Further refinement of the device may require new techniques.

Semiconductor 12 consists of a film or crystal of germanium which strongly absorbs infrared radiation. Other semiconductors such as silicon, selenium or indium antimonide can be used in place of germanium. The requirement for the semiconductor 12 is that it strongly absorbs infrared radiation having a wavelength shorter than some minimum value that is determined by the width of the forbidden gap or band of the semiconductor, or the extrinsic absorption associated with impurities. The semiconductor 14 is formed of a moderate resistivity n-type semiconducting phosphorescent material such as cadmium sulfide. Other types of phosphorescent material can, of course, be utilized. The corresponding temperatures at which such materials will be utilized depends on the temperature characteristics of the luminescent processes of the selected material.

For infrared to visible light conversion the semiconducting material 14 should have a band gap between the limits 1.8–3.1 e.v. which corresponds to the visible light spectrum of approximately 4,000–7,000 angstroms. On the other hand, if it is desired to convert infrared radiation into ultraviolet radiation the luminescing semiconducting material 14 should have a band gap greater than 3.1 e.v.

Terminals 18 and 20 are provided to couple a suitable bias voltage respectively between the semiconductor 12 and 14. The materials mentioned above for use as the semiconductor 14 and the thin film insulator 16 are chosen so as to be transparent to infrared radiation. Thus, in operation the infrared radiation is directed so as to impinge on the infrared absorbing narrow band gap semiconductor 12 either by direct radiation or by transmission through semiconductor 14 and insulating film 16. Intrinsic absorption of infrared photons in the semiconductor 12 generates free electrons and holes, or in the case of extrinsic absorption only free holes would be generated. It is to be understood that operation of the converter 10 only requires that minority carriers be freed. With the converter 10 biased such that the valence bands are at the same energy, the holes can tunnel into the wide band gap semiconductor 14 and recombine with the electrons, thus providing visible photons having an energy of the wide band gap semiconductor 14. Also, there is a possibility that some of the visible photons generated in the wide band gap semiconductor 14 could be absorbed by the narrow band gap semiconductor 12, thus generating more holes in semiconductor 12. These holes could then tunnel back into semiconductor 14, thus giving amplification and persistence of the visible output. Although the above description has been given as a tunneling operation, tunneling is only one of the mechanisms by which the minority carriers can be conveyed across the junction.

Figures 2, 3, 4:
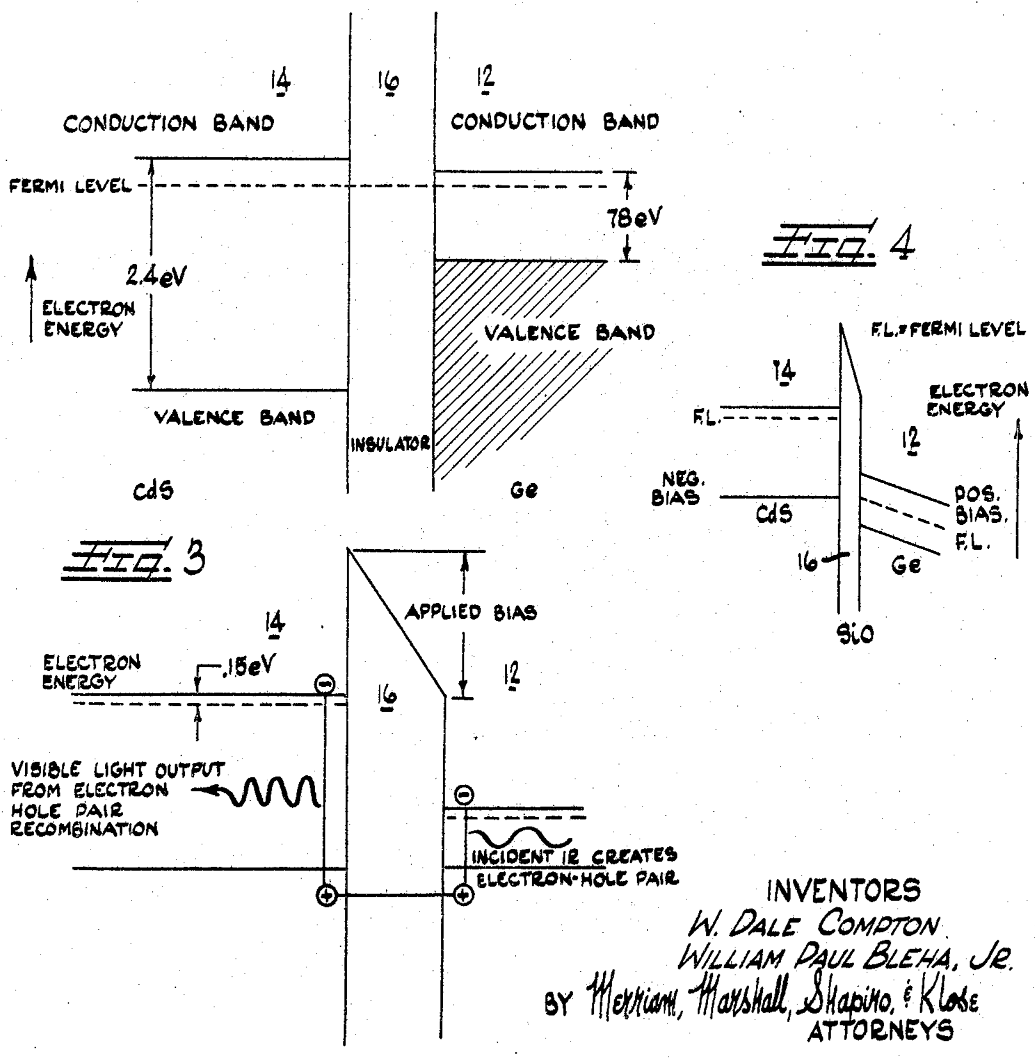
FIGURE 2 is an energy band diagram illustrating an example of the energy bands for the converter materials of FIGURE 1 without a bias voltage.
FIGURE 3 is an energy band diagram similar to that illustrated in FIGURE 2, and showing the changes in the energy bands resulting from an application of a bias voltage between the two semiconductors.
FIGURE 4 is an energy band diagram similar to that illustrated in FIGURE 3, which shows another mode of operation. The bias voltage is shown divided between the insulating film 16 and the narrow band semiconductor 12. Impinging infrared radiation decreases the bias voltage across semiconductor 12, thereby increasing the bias voltage across insulating film 16.

The above operation can be more clearly seen by referring to the diagrams of FIGURES 2 and 3. All of the effects of band bending will be neglected in the following discussion although it must be realized that such effects will modify the details of the following operation, but not the general inventive concepts thereof. For the illustrated embodiment of n-type semiconductors 12 and 14, neglecting band bending at the surface, in the absence of a bais voltage the Fermi levels will coincide as shown in FIGURE 2. The band gap energy of germanium, which is indicated as the narrow band gap semiconductor 12, is approximately 0.78 e.v., while the band gap energy of cadmium sulfide illustrated for the wide band gap semiconductor 14 is approximately 2.4 e.v. A bias voltage is supplied such that terminal 18 is positive with respect to terminal 20. The magnitude of the applied voltage is determined by the difference in the band gap of the two semiconductors. For the illustrated conversion device 10 composed of cadmium sulfide and germanium, the applied voltage should be approximately 1.7 volts. The bias voltage is chosen such that the tops of the valence bands of the two semiconductors 12 and 14 are just opposite each other as illustrated most clearly in FIGURE 3. Under these conditions, holes produced by absorption of photons in germanium will tunnel through the insulating film 16, recombine with electrons in the cadmium sulfide section and thereby generate photons of light. Thus, there is provided a visible light output from semiconductor 14 which corresponds to the incident infrared radiation on semiconductor 12.

Although the above description has been given for n-type semiconductors, the same result could be obtained for p-type semiconductors. When utilizing p-type semiconductors, electrons generated by the incident infrared radiation would tunnel between the semiconductors and recombine with holes to provide the visible light output.

The above description in connection with FIGURES 2 and 3 applies to the case of low resistivity semiconductors where substantially the entire bias appears across the insulating barrier 16. FIGURE 4 illustrates another mode of operation possible when the narrow gap semiconductor 12 has a large dark resistance characteristic. It is to be noted that the bias voltage is shown divided between the insulating film 16 and semiconductor 12. In this example the absorption of infrared radiation in semiconductor 12 alters the resistance of the semiconductor film sufficiently to provide an effective change in bias across the junction region between semiconductors 12 and 14. The impinging infrared radiation on semiconductor 12 decreases the bias voltage across semiconductor 12, thereby effectively increasing the bias voltage across the insulating film 16. Holes in the valence band of the wide band gap semiconductor 14 result since electrons leave it to enter the conductor band of the narrow gap semiconductor 14. This type of operation is possible for more materials than the examples of FIGURES 2 and 3, since there is no restriction as to whether the material is n or p-type or on the magnitude of the band gap. For operation in connection with FIGURE 4, it is only necessary that the semiconductor material 12 be a photoconductor in the desired wavelength region, and have a large dark resistance characteristic at the operating temperature.

While it appears that the insulating barrier 16 between the semiconductors 12 and 14 is preferred, some preliminary experiments with sandwich structures such as shown in FIGURE 1, but without an intentional oxide intermediate insulating layer, also exhibited electroluminescence. A barrier in these cases could have been caused by absorbed surface contamination, surface damage, or could be the result of band bending due to the differences of electron affinities in the two semiconductors 12 and 14.

The foregoing detailed description has been given for clearness of understanding only, and no unnecessary limitations should be understood therefrom, as modifications will be obvious to those skilled in the art.

We claim:

1. An infrared converter comprising:

a relatively narrow band gap semiconductor for absorbing infrared radiation incident thereon and developing free minority carriers;

a relatively wide band gap semiconductor immediately adjacent said narrow band gap semiconductor for recombining said minority carriers with majority carriers; and a thin insulating barrier immediately between and adjacent said narrow band gap and said wide band gap semiconductors, said insulating barrier being sufficiently thin so as to enable the tunneling of said free minority carriers therethrough from said narrow band gap semiconductor to said wide band gap semiconductor, thereby developing radiation stimulation by said incident infrared radiation.

2. An infrared converter as claimed in claim 1, wherein said insulating barrier comprises a thin film of insulating material about 100 angstroms in thickness.

3. An infrared converter as claimed in claim 1, wherein said narrow band gap semiconductor comprises a semiconductor having a forbidden band equal to or less than 1.8 electron volts.

4. An infrared converter as claimed in claim 1, wherein said wide band gap semiconductor comprises a semiconductor having a forbidden band equal to or greater than 1.8 electron volts.

5. An infrared converter as claimed in claim 1, wherein said wide band gap semiconductor comprises a semiconductor having a forbidden band greater than 3.1 electron volts for developing radiation in the ultraviolet light region.

6. An infrared converter as claimed in claim 1, wherein said wide band gap semiconductor comprises a semiconductor having a forbidden band between 1.8 and 3.1 electron volts for developing radiation in the visible light region.

7. An infrared converter as claimed in claim 6, wherein said narrow band gap semiconductor comprises a germanium crystal, and said wide band gap semiconductor comprises a cadmium sulfide crystal.

8. An infrared converter as claimed in claim 1, wherein said narrow band gap semiconductor is a photoconductor.

9. A method of converting infrared radiation to other wavelengths comprising:

providing a thin film of insulating material about 100 angstroms in thickness intermediate a relatively narrow band gap semiconductor and a relatively wide band gap semiconductor;

directing infrared radiation onto said narrow band gap semiconductor, said narrow band gap semiconductor absorbing said infrared radiation incident thereon and developing free minority carriers, said minority carriers tunneling through said thin insulating film and recombining with majority carriers in said relatively wide band gap semiconductor, thereby developing radiation stimulated by said incident infrared radiation.

References Cited

UNITED STATES PATENTS

| | | | |
|---|---|---|---|
| 3,329,823 | 7/1967 | Hanoy et al. | 250—213 |
| 3,339,075 | 8/1967 | Szepesi | 250—213 |

ARCHIE R. BORCHELT, Primary Examiner

M. ABRAMSON, Assistant Examiner

U.S. Cl. X.R.

250—213; 317—235